US012696421B2

(12) United States Patent
Nedungadi et al.

(10) Patent No.: US 12,696,421 B2
(45) Date of Patent: Jul. 28, 2026

(54) METHODS FOR MANAGING COMPUTER NETWORK CABLES

(71) Applicant: Nile Global, Inc., San Jose, CA (US)

(72) Inventors: Promode Nedungadi, San Jose, CA (US); Vigneshwara Upadhyaya, Bangalore (IN)

(73) Assignee: Nile Global, Inc., San Jose, CA (US)

( * ) Notice: Subject to any disclaimer, the term of this patent is extended or adjusted under 35 U.S.C. 154(b) by 99 days.

(21) Appl. No.: 18/677,742

(22) Filed: May 29, 2024

(65) Prior Publication Data

US 2025/0344338 A1 Nov. 6, 2025

Related U.S. Application Data

(60) Provisional application No. 63/641,807, filed on May 2, 2024.

(51) Int. Cl.
H05K 7/14 (2006.01)

(52) U.S. Cl.
CPC ......... H05K 7/1491 (2013.01); H05K 7/1492 (2013.01)

(58) Field of Classification Search
None
See application file for complete search history.

(56) References Cited

U.S. PATENT DOCUMENTS 3,781,761 A 12/1973 Harwood
D339,982 S * 10/1993 Rodriguez Prados ......... D8/356

D468,996 S 1/2003 Sarkinen et al.
D632,547 S 2/2011 Thompson
8,998,151 B2 4/2015 Hoek
2007/0031102 A1* 2/2007 McNutt ................ G02B 6/3897
385/135
2009/0179119 A1 7/2009 Wallingford et al.
2010/0163278 A1 7/2010 Grelck
(Continued)

OTHER PUBLICATIONS

Rexel, "Leviton—49255-H48", https://www.rexelusa.com/p/56784/leviton/patch-panel-quickport-48-port-2rmu-35-h-x-19-w/078477387986/49255-h48, retrieved from the internet Mar. 5, 2024, 3 pgs.

(Continued)

*Primary Examiner* — James Wu
*Assistant Examiner* — Christopher L Augustin
(74) *Attorney, Agent, or Firm* — LOZA & LOZA, LLP

(57) ABSTRACT

A method for managing computer network cables is disclosed. The method includes inserting a cable holding tool between two rows of computer network cables that are connected to a multiport network device, the cable holding tool having two rows of notches on opposite long edges of the cable holding tool, after the cable holding tool is inserted between the two rows of computer network cables, inserting the computer network cables into the notches of the two rows of notches, after the computer network cables are inserted into the notches of the two rows of notches, disconnecting the computer network cables from the multiport network device, and after the computer network cables are disconnected from the multiport network device, moving the cable holding tool, which has the computer network cables inserted into the notches of the two rows of notches, away from the multiport network device.

15 Claims, 14 Drawing Sheets

(56)           References Cited

U.S. PATENT DOCUMENTS

| | | | |
|---|---|---|---|
| 2015/0282372 A1* | 10/2015 | Sakurai | H05K 7/1492 |
| | | | 29/857 |
| 2019/0380221 A1 | 12/2019 | Gupta et al. | |
| 2021/0116053 A1 | 4/2021 | Lindmark | |
| 2021/0279437 A1 | 9/2021 | Marley et al. | |
| 2022/0163744 A1 | 5/2022 | Schoenfelder | |
| 2024/0120723 A1 | 4/2024 | Bindi et al. | |

OTHER PUBLICATIONS

LaPlus Connectivity Inc., "1U 48 Port Shielded High Density Empty Patch Panel *Cable Manager (Empty)" LPF003S, https://www.laplusconnect.com/en/products/45/1u-48-port-shielded-high-density-empty-patch-panel-cable-manager--empty, retrieved from the internet on Mar. 5, 2024, 3 pgs.
Leviton, "Field-Configurable Patch Panel & Patch Block", 2004, 2 pgs.
Non-Final Office Action for U.S. Appl. No. 18/677,730, dated Jun. 11, 2025, 15 pages.

* cited by examiner

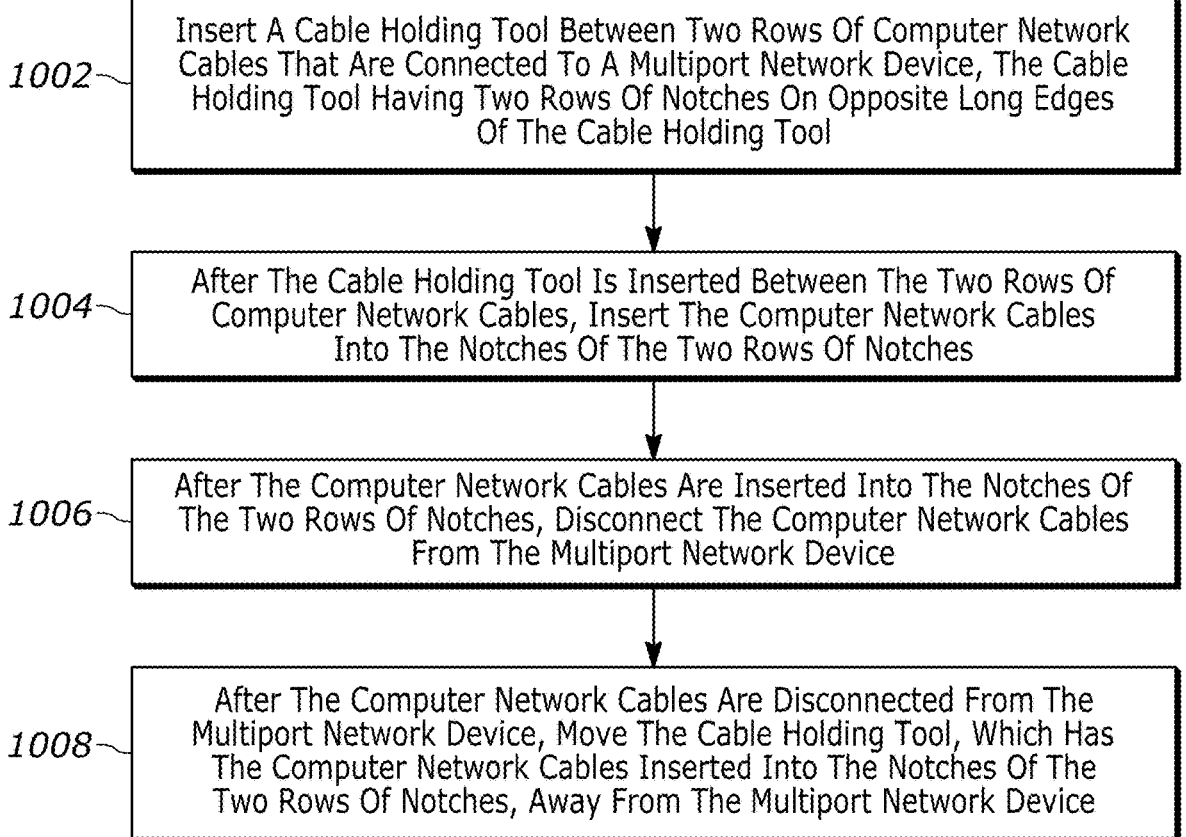

1002— Insert A Cable Holding Tool Between Two Rows Of Computer Network Cables That Are Connected To A Multiport Network Device, The Cable Holding Tool Having Two Rows Of Notches On Opposite Long Edges Of The Cable Holding Tool 1004— After The Cable Holding Tool Is Inserted Between The Two Rows Of Computer Network Cables, Insert The Computer Network Cables Into The Notches Of The Two Rows Of Notches 1006— After The Computer Network Cables Are Inserted Into The Notches Of The Two Rows Of Notches, Disconnect The Computer Network Cables From The Multiport Network Device 1008— After The Computer Network Cables Are Disconnected From The Multiport Network Device, Move The Cable Holding Tool, Which Has The Computer Network Cables Inserted Into The Notches Of The Two Rows Of Notches, Away From The Multiport Network Device

FIG. 10

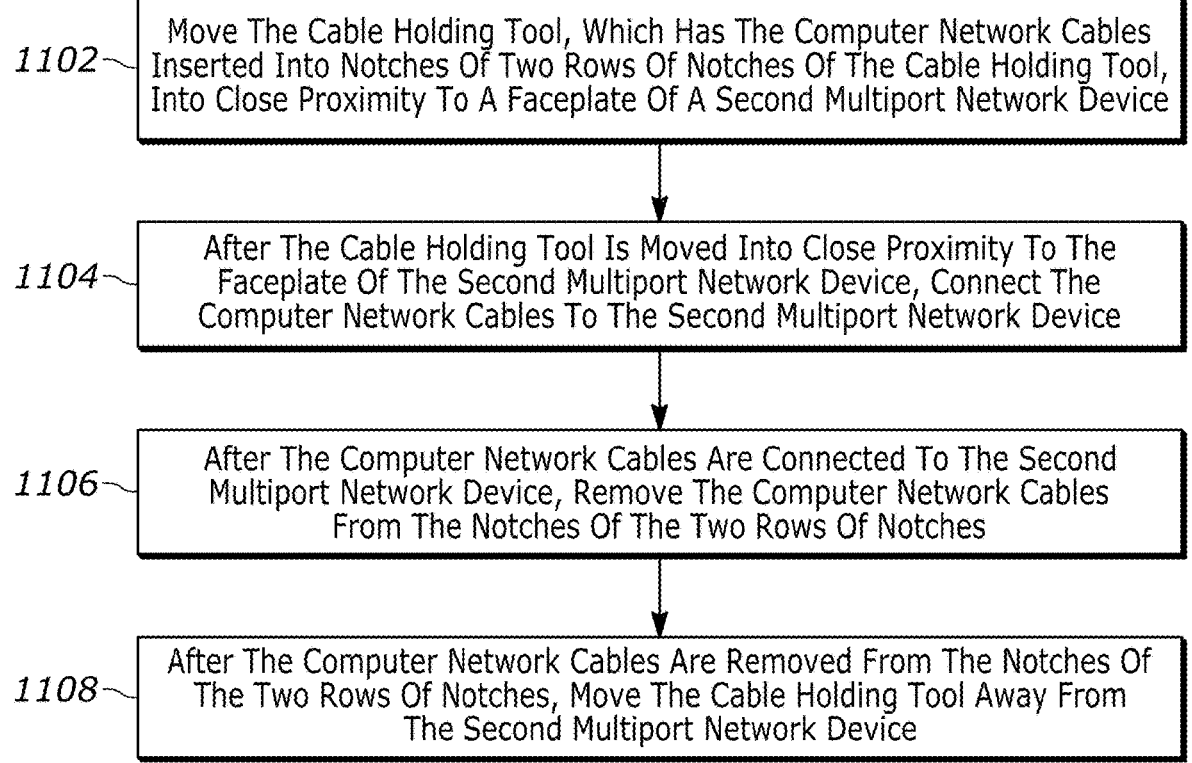

1102 — Move The Cable Holding Tool, Which Has The Computer Network Cables Inserted Into Notches Of Two Rows Of Notches Of The Cable Holding Tool, Into Close Proximity To A Faceplate Of A Second Multiport Network Device 1104 — After The Cable Holding Tool Is Moved Into Close Proximity To The Faceplate Of The Second Multiport Network Device, Connect The Computer Network Cables To The Second Multiport Network Device 1106 — After The Computer Network Cables Are Connected To The Second Multiport Network Device, Remove The Computer Network Cables From The Notches Of The Two Rows Of Notches 1108 — After The Computer Network Cables Are Removed From The Notches Of The Two Rows Of Notches, Move The Cable Holding Tool Away From The Second Multiport Network Device

FIG. 11

METHODS FOR MANAGING COMPUTER NETWORK CABLES

CROSS-REFERENCE TO RELATED APPLICATION

This application claims priority to provisional U.S. Patent Application Ser. No. 63/641,807, filed May 2, 2024, which is incorporated by reference herein, and is related to co-pending U.S. patent application Ser. No. 18/677,730, filed May 29, 2024, entitled CABLE HOLDING TOOL FOR MANAGING COMPUTER NETWORK CABLES.

BACKGROUND

In enterprise campus networks, multiport network devices, such as Ethernet switches, are very common and there are may be many of such devices installed with a multitude of ports. The ports are typically connected by computer network cables to a wide variety of devices, which may include access points, Internet of Things (IoT) devices, and client devices such as desktop computers, printers, servers, and security cameras. In a typical enterprise campus network, there may be many of these Ethernet switches distributed throughout the campus, with each Ethernet switch having 24 or 48 ports and a cable connected to each port. It is known that such multiport network devices may need to be changed out, e.g., due to failure or equipment upgrade. During a change out of a multiport network device it is important that the order of the cables that are connected to the device be maintained when the cables are connected to a new device. Disconnecting and reconnecting cables in a device change out is typically a manual process in which a technician labels each cable and/or keeps notes on the port number of each cable. Such a manual process can be labor intensive and prone to errors.

SUMMARY

Embodiments of a device and method are disclosed. Embodiments of a device and method are disclosed.

A device for holding computer network cables includes an elongated body having a first major surface, a second major surface, a first long edge, and a second long edge, wherein the first long edge connects the first major surface to the second major surface, and wherein the second long edge connects the first major surface to the second major surface, a first plurality of notches formed along the first long edge, and a second plurality of notches formed along the second long edge.

In an example, the notches of the first plurality of notches have positions in the elongated body that match positions of ports of a multiport network device that has two rows of ports, and the notches of the second plurality of notches have positions in the elongated body that match positions of ports of the multiport network device that has two rows of ports.

In an example, the notches of the first plurality of notches are narrower near the first long edge than near the second long edge, and the notches of the second plurality of notches are narrower near the second long edge than near the first long edge.

In an example, the first plurality of notches are equidistant from each other along the first long edge, and wherein the second plurality of notches are equidistant from each other along the second long edge.

In an example, the notches of the first plurality of notches have a bulbous shape, and the notches of the second plurality of notches have a bulbous shape.

In an example, the notches of the first plurality of notches are narrower at a top than at a bottom, and the notches of the second plurality of notches are narrower at a top than at a bottom.

In an example, the notches of the first plurality of notches form an approximately 4.5 mm wide opening and an approximately 6 mm wide holding area, and the notches of the second plurality of notches form an approximately 4.5 mm wide opening and an approximately 6 mm wide holding area.

In an example, the first long edge is covered by protective coating in the areas of the notches of the first plurality of notches, and the second long edge is covered by protection coating in the areas of the notches of the second plurality of notches.

In an example, the elongated body has two ends opposite each other and a handle portion at one of the two ends.

In an example, the elongated body has two ends opposite each other and a handle portion at each of the two ends.

Another example of a device for holding computer network cables is disclosed. The device includes an elongated body having a first major surface, a second major surface, a first long edge, and a second long edge, wherein the first long edge connects the first major surface to the second major surface, and wherein the second long edge connects the first major surface to the second major surface, and a first plurality of notches formed along the first long edge.

In an example, the further includes a second plurality of notches formed along the second long edge.

Another example of a device for holding computer network cables is disclosed. The device includes an elongated body having a first major surface, a second major surface, a first long edge, and a second long edge, wherein the first long edge connects the first major surface to the second major surface, and wherein the second long edge connects the first major surface to the second major surface, means, formed along the first long edge, for holding a first plurality of network cables, and means, formed along the second long edge, for holding a second plurality of network cables.

A method for managing computer network cables is disclosed. The method includes inserting a cable holding tool between two rows of computer network cables that are connected to a multiport network device, the cable holding tool having two rows of notches on opposite long edges of the cable holding tool, after the cable holding tool is inserted between the two rows of computer network cables, inserting the computer network cables into the notches of the two rows of notches, after the computer network cables are inserted into the notches of the two rows of notches, disconnecting the computer network cables from the multiport network device, and after the computer network cables are disconnected from the multiport network device, moving the cable holding tool, which has the computer network cables inserted into the notches of the two rows of notches, away from the multiport network device.

In an example, inserting the cable holding tool between the two rows of computer network cables involves sliding the cable holding tool across the faceplate of the multiport network device.

In an example, inserting the cable holding tool between the two rows of computer network cables involves sliding the cable holding tool across the faceplate of the multiport network device while first and second major surfaces of the cable holding tool are approximately perpendicular to the faceplate of the multiport network device.

In an example, inserting the computer network cables into the notches of the two rows of notches includes rotating the cable holding tool so that a major surface of the cable holding tool is approximately parallel to a faceplate of the multiport network device.

In an example, rotating the cable holding tool involves rotating the cable holding tool from a position in which first and second major surfaces of the cable holding tool are approximately perpendicular to the faceplate of the multiport network device to a position in which the first and second major surfaces of the cable holding tool are approximately parallel to the faceplate of the multiport network device.

In an example, the method further involves moving the cable holding tool, which has the computer network cables inserted into notches of two rows of notches of the cable holding tool, into close proximity to a faceplate of a second multiport network device, after the cable holding tool is moved into close proximity to the faceplate of the second multiport network device, connecting the computer network cables to the second multiport network device, after the computer network cables are connected to the second multiport network device, removing the computer network cables from the notches of the two rows of notches, and after the computer network cables are removed from the notches of the two rows of notches, moving the cable holding tool away from the second multiport network device.

In an example, removing the computer network cables from the notches of the two rows of notches includes rotating the cable holding tool.

In an example, removing the computer network cables from the notches of the two rows of notches includes rotating the cable holding tool to be approximately perpendicular to the faceplate of the multiport network device.

In an example, removing the computer network cables from the notches of the two rows of notches includes rotating the cable holding tool approximately 90 degrees.

Another example of a method for managing computer network cables is disclosed. The method involves moving a cable holding tool, which has computer network cables inserted into notches of two rows of notches of the cable holding tool, into close proximity to a faceplate of a multiport network device, after the cable holding tool is moved into close proximity to the faceplate of the multiport network device, connecting the computer network cables to the multiport network device, after the computer network cables are connected to the multiport network device, removing the computer network cables from the notches of the two rows of notches, and after the computer network cables are removed from the notches of the two rows of notches, moving the cable holding tool away from the multiport network device.

In an example, removing the computer network cables from the notches of the two rows of notches includes rotating the cable holding tool.

In an example, removing the computer network cables from the notches of the two rows of notches includes rotating the cable holding tool to be approximately perpendicular to the faceplate of the multiport network device.

In an example, removing the computer network cables from the notches of the two rows of notches includes rotating the cable holding tool approximately 90 degrees.

In an example, moving the cable holding tool away from the multiport network device involves sliding the cable holding tool across the faceplate of the multiport network device.

In an example, moving the cable holding tool away from the multiport network device involves sliding the cable holding tool across the faceplate of the multiport network device while the cable holding tool is approximately perpendicular to the faceplate of the multiport network device.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 10 is a process flow diagram of a method for disconnecting cables from a multiport network device using a cable holding tool.

FIG. 11 is a process flow diagram of a method for connecting cables to a multiport network device using a cable holding tool.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1A:
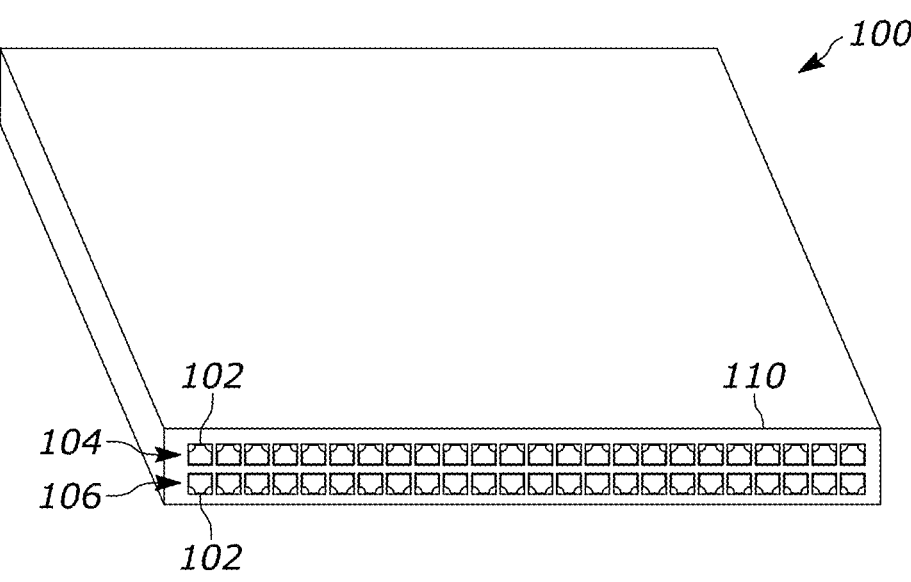
FIG. 1A is a perspective view of an example of a multiport network device.

FIG. 1A is a perspective view of an example of a multiport network device 100. In the example of FIG. 1, the multiport network device may be a switch, a router, or some combination thereof, although the multiport network device may perform other computer network functions. In an example, the multiport network device is stored in a rack (not shown) that holds multiple different multiport network devices and each individual unit in the rack may be referred to as a "rack unit" or simply as an "RU." The multiport network device includes components within the device that process digital data, often in the form of protocol data units (PDUs) or packets. The network device includes communications interfaces 102 that provide data connections to communications media such as optical fibers and/or twisted pair wires. The communications interfaces includes port connectors, or "ports," that enable the communications media to connect to the multiport network device. In an example, the port connectors are female port connectors, such as RJ45 female port connectors. In the example of FIG. 1A, the multiport network device includes 48 ports organized in two rows 104 and 106 of 24 ports per row, with the ports being accessible from a faceplate 110 of the multiport network device. In the example, the ports are in linear rows of ports, with one port from the top row 104 being vertically aligned with one port form the bottom row 106. In the example of FIG. 1A, the rows of 24 ports are broken into groups of six ports that are equally spaced apart from each other with a larger separation between each of the groups of ports. In other examples, all of the ports in a row are equally spaced. The spacing between ports may be standardized, e.g., across vendors or products types, or the spacing between ports may be different, e.g., for each vendor and or product type. Although the example multiport network device of FIG. 1A includes 48 ports in two rows of 24 ports, other numbers and configurations of ports are possible. For example, multiport network devices with 24 ports (two rows of 12 ports) are common. In the example of FIG. 1A, there is no communications media (e.g., twisted pair wires or optical fibers, often referred to as "cables") connected to the communications interfaces 102 (e.g., ports) of the multiport network device.

Figure 1B:
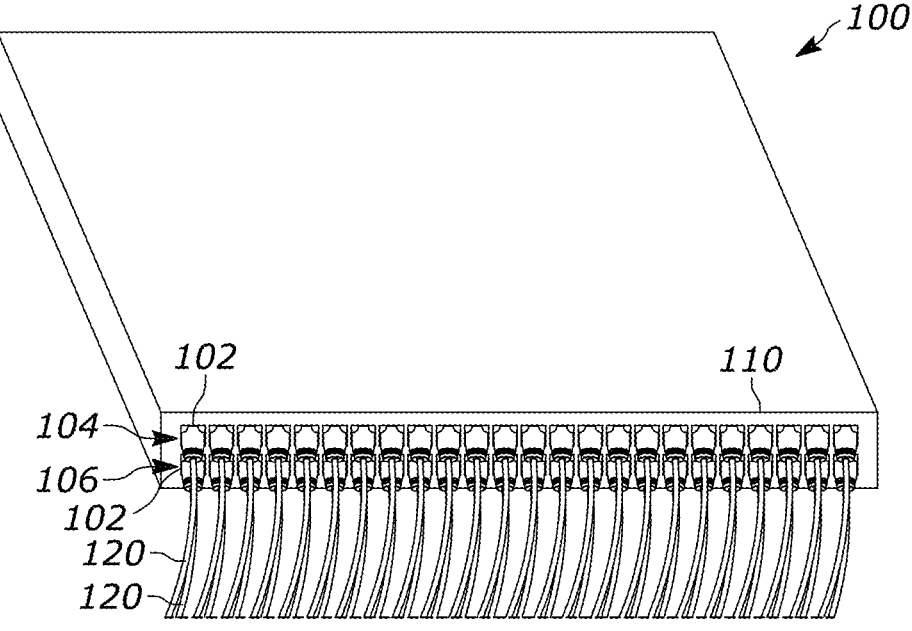
FIG. 1B is a perspective view of the multiport network device of FIG. 1A with cables connected to all 48 ports of the multiport network device.

FIG. 1B is a perspective view of the multiport network device 100 of FIG. 1A with cables 120 connected to all 48 ports 102 of the multiport network device. In an example, the cables are CAT6 cables (e.g., for Ethernet) that are round with a diameter of approximately 6 mm and each cable has a male connector (e.g., an RJ45 male) at the end. Although an example of a type of cable and a type of connector are described, different types of communications media can be connected to ports of a multiport network device.

As described above, a multiport network device may have 24 or 48 ports, with each port having a computer network cable connected thereto. While in use, it is often necessary to change out a multiport network device, e.g., remove from a rack and replace with another multiport network device, due to, for example, maintenance needs or to update the equipment. During a change out of a multiport network device it is important that the order of the cables that are connected to the device be maintained when the cables are connected to a new device. For example, it is often the case that all of the cables are disconnected from the multiport network device, the device is removed from a rack, a new device is inserted into the exact same spot in the rack, and the cables are connected to the newly inserted device. Disconnecting and reconnecting cables in a device change out is typically a manual process in which a technician labels each cable and keeps notes on the port number of each cable. This manual process can be labor intensive and prone to errors.

It has been realized that a cable holding tool may be used to more efficiently swap a first multiport network device with a second multiport network device while ensuring that all of the cables are connected to the second multiport network device in the exact same order as they were in before being disconnected from the first multiport network device. In an example, a cable holding device includes an elongated body having a first major surface, a second major surface, a first long edge, and a second long edge, wherein the first long edge connects the first major surface to the second major surface, and wherein the second long edge connects the first major surface to the second major surface, a first plurality of notches formed along the first long edge, and a second plurality of notches formed along the second long edge. A cable holding tool as disclosed herein enables a technician to disconnect all of the cables from the ports of a multiport network device, swap out the multiport network device with a new multiport network device, and then connect all of the cables to the ports of the new multiport network device in the exact same order as they were in without having to label or otherwise track the order of the cables while the cables are disconnected. Therefore, the cable holding tool can greatly improve the efficiency and accuracy of such a cable management operation.

Figures 2A, 2B:
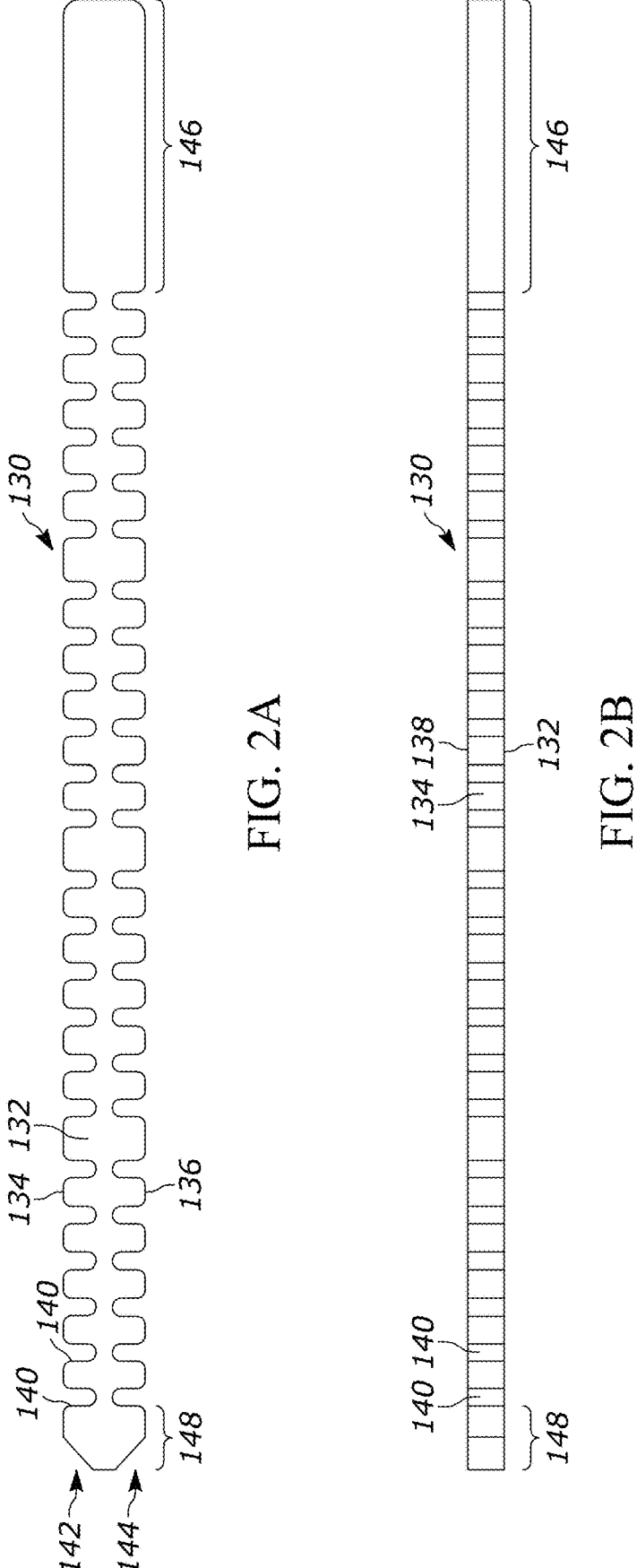
FIG. 2A is a front view of an example of cable holding tool.
FIG. 2B is a side view of the cable holding tool from FIG. 2A.

FIG. 2A is a front view of an example of cable holding tool 130. The cable holding tool includes an elongated body 131 having a first major surface 132, a second major surface (not visible in the front view), a first long edge 134, and a second long edge 136. FIG. 2B is a side view of the cable holding tool 130 from FIG. 2A showing the first long edge 134. In the side view of FIG. 2B, it can be seen that the first long edge 134 connects the first major surface 132 to the second major surface 138, and although not shown in FIG. 2B, the second long edge connects the first major surface to the second major surface. With reference to FIG. 2A, the cable holding tool includes 24 notches 140 formed along the first long edge 134 and 24 notches formed along the second long edge 136. In the example of FIG. 2A, the notches are in linear rows 142 and 144, with one notch of the first long edge being vertically aligned with one notch of the second long edge. In addition, the rows of 24 ports formed along the first and second long edges are broken into groups of six notches that are equally spaced apart from each other with a larger separation between each of the groups of notches.

In an example and as is described below, the notches 140 formed along the first long edge 134 of the cable holding tool 130 have positions in the elongated body 131 that match positions of a first row of ports of a multiport network device that has two rows of ports, and the notches formed along the second long edge 136 of the cable holding tool have positions in the elongated body that match positions of a second row of ports of the multiport network device that has two rows of ports. As is described in further detail below, the position of the notches in the cable holding tool should match the position of the ports at the faceplate of a multiport network device. Thus, it can be understood that cable holding tools with different layouts of notches may be configured to match a variety of different port layout schemes for different multiport network devices.

In an example, the notches 140 in the cable holding tool 130 are shaped to receive a round cable such as a CAT 6 cable and to securely hold the cable until forcibly removed from the corresponding notch. For example, the notches formed along the first long edge 134 of the cable holding tool have a shape that is narrower near the first long edge than near the second long edge 136, and the notches formed along the second long edge of the cable holding tool have a shape that is narrower near the second long edge than near the first long edge. The notches can be described as having a "bulbous" shape. In an example, the rounded or "bulbous" end of a notch has a diameter that is slightly larger than the diameter of the expected cable, e.g., slightly larger than 6 mm, e.g., around 0.5 mm larger (e.g., ±20%), although other clearance distances are possible. Additionally, in an example, the narrower portion of the notch is slight smaller than the diameter of the expected cable, e.g., slightly smaller than 6 mm, e.g., 1.5 mm smaller (e.g., ±20%). A CAT 6 cable is typically compressible enough that the cable can be pressed through the narrow portion of the notch even when the opening in the notch is smaller than the diameter of the cable when the cable is not under any compressive force. Thus, with such a configuration of the notches, cables can be inserted into the notches of the cable holding tool with force applied from human fingers, held securely in place by the cable holding tool while no force is applied, and then removed from the notches of the cable holding tool with force applied from human fingers.

Figure 2C:
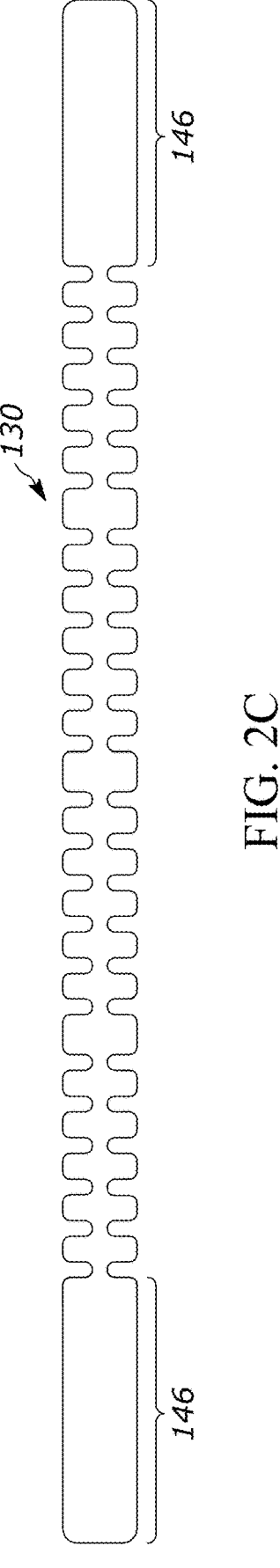
FIG. 2C is an example of a cable handling tool, which is similar to the cable handling tool of FIGS. 2A and 2B, except that the tool has two handles.

In the example of FIGS. 2A and 2B, the cable holding tool 130 has one end with a section that has no notches. The section of the cable handling tool with no notches can serve as a handle for the cable holding tool. That is, a user of the tool can grasp the cable handling tool from the "handle" end of the tool. In the example of FIGS. 2A and 2B, the end of the tool opposite the handle end has a much shorter section 148 with no notches and this end is not as easy to grasp. In another example, the cable handling tool may have a "handle" portion at each end of the tool. FIG. 2C is an example of a cable handling tool 130, which is similar to the cable handling tool of FIGS. 2A and 2B, except that the tool has two handles, e.g., a section 146 on both ends of the cable handling tool that server as handles. Additionally, in other examples, the portion of the cable handling tool that has no notches (e.g., the ends of the tool) can be longer or shorter than what is shown in FIGS. 2A, 2B, and 2C.

Figures 3A, 3B:
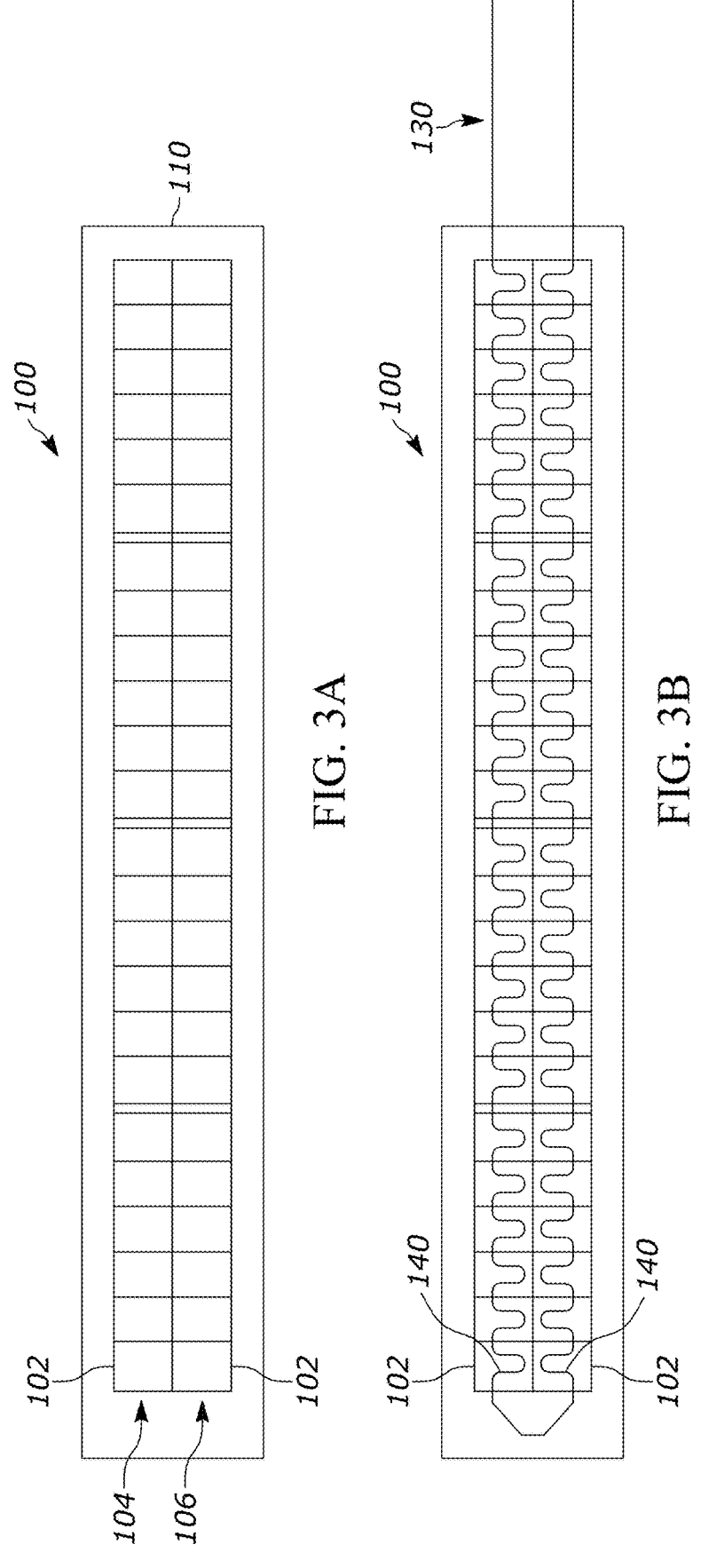
FIG. 3A is a front on view of the multiport network device described with reference to FIGS. 1A and 1B.
FIG. 3B is a front view of the multiport network device with a cable holding tool laid over the face of the multiport network device.

FIG. 3A is a front on view of the multiport network device 100 described with reference to FIGS. 1A and 1B. The multiport network device includes 48 ports 102 that are grouped into four groups of six ports. In the example, the ports are in two linear rows 104 and 106 of 24 ports in each row. As described above, the position of the notches of a cable holding tool should match the positions of the ports of the multiport network device. FIG. 3B is a front view of the multiport network device with the cable holding tool 130 laid over the face of the multiport network device. As illustrated in FIG. 3B, the positions of the notches of the cable holding tool match the positions of the ports of the multiport network device. As is described below, the cable holding tool enables a set of cables to be disconnected from the multiport network device and then reconnected (e.g., to a new multiport network device swapped into the same position in a rack) in an efficient way that maintains the order of the cables.

An example of a technique for managing computer network cables using such a cable holding tool involves inserting a cable holding tool between two rows of computer network cables that are connected to a multiport network device, the cable holding tool having two rows of notches on opposite long edges of the cable holding tool, after the cable holding tool is inserted between the two rows of computer network cables, inserting the computer network cables into the notches of the two rows of notches, after the computer network cables are inserted into the notches of the two rows of notches, disconnecting the computer network cables from the multiport network device, and after the computer network cables are disconnected from the multiport network device, moving the cable holding tool, which has the computer network cables inserted into the notches of the two rows of notches, away from the multiport network device The above technique can be used to disconnect cables from a multiport network device, such as a 24 or 48 port network switch. After the computer network cables are disconnected from the multiport network device, it may be desirable to connect the cables to a multiport network device, e.g., to a new multiport network device that has been installed at the same position in a rack, or to the same multiport network device after some maintenance operation. An example of a technique for managing computer network cables, e.g., connecting cables to a second device after the cables have been disconnected from a first device, involves moving a cable holding tool, which has computer network cables inserted into notches of two rows of notches of the cable holding tool, into close proximity to a faceplate of a multiport network device, after the cable holding tool is moved into close proximity to the faceplate of the multiport network device, connecting the computer network cables to the multiport network device, after the computer network cables are connected to the multiport network device, removing the computer network cables from the notches of the two rows of notches, and after the computer network cables are removed from the notches of the two rows of notches, moving the cable holding tool away from the multiport network device.

A technique for using a cable holding tool, such as the cable holding tool described above, to disconnect cables from a multiport network device is described with reference to FIGS. 4A-4D and a technique for using the cable holding tool to disconnect cables from a multiport network device is described with reference to FIGS. 5A-5D.

Figure 4A:
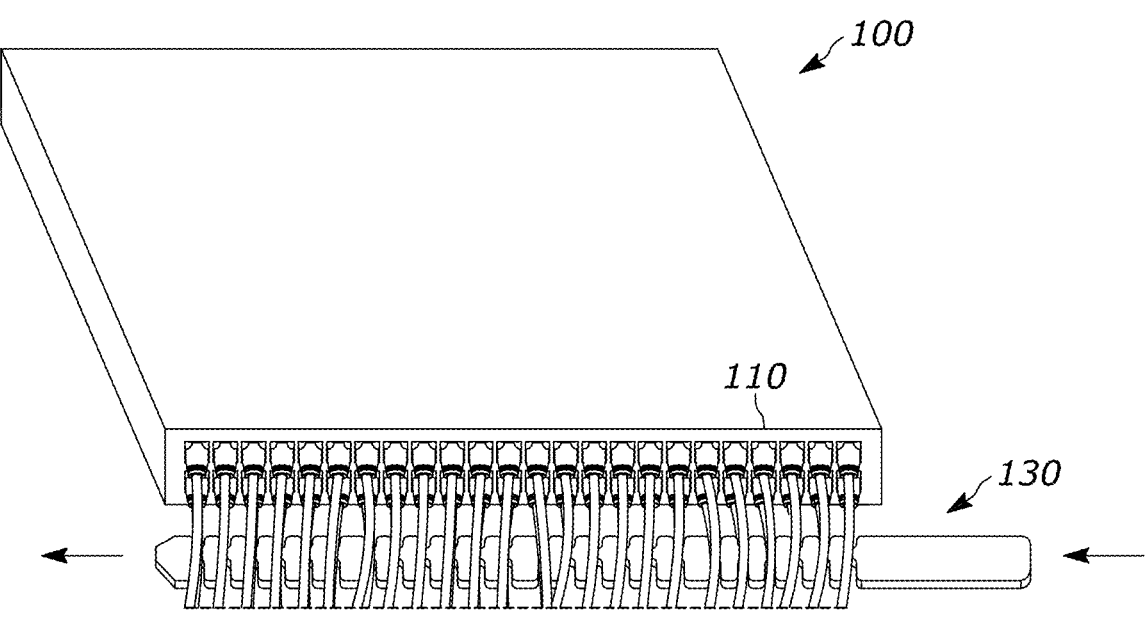
FIG. 4A illustrates a step in a process for disconnecting cables from a multiport network device using a cable holding tool.

FIG. 4A illustrates a step that involves inserting the cable handling tool 130 between the two rows of cables, which are connected to ports of the multiport network device. As illustrated in FIG. 4A, the cable holding tool is positioned so that the first and second major surfaces of the cable holding tool are approximately perpendicular (e.g., to within ±10%) to the faceplate of the multiport network device. In an example, the cable holding tool is slide between the two rows of cables, e.g., horizontally across the faceplate of the multiport network device.

Figure 4B:
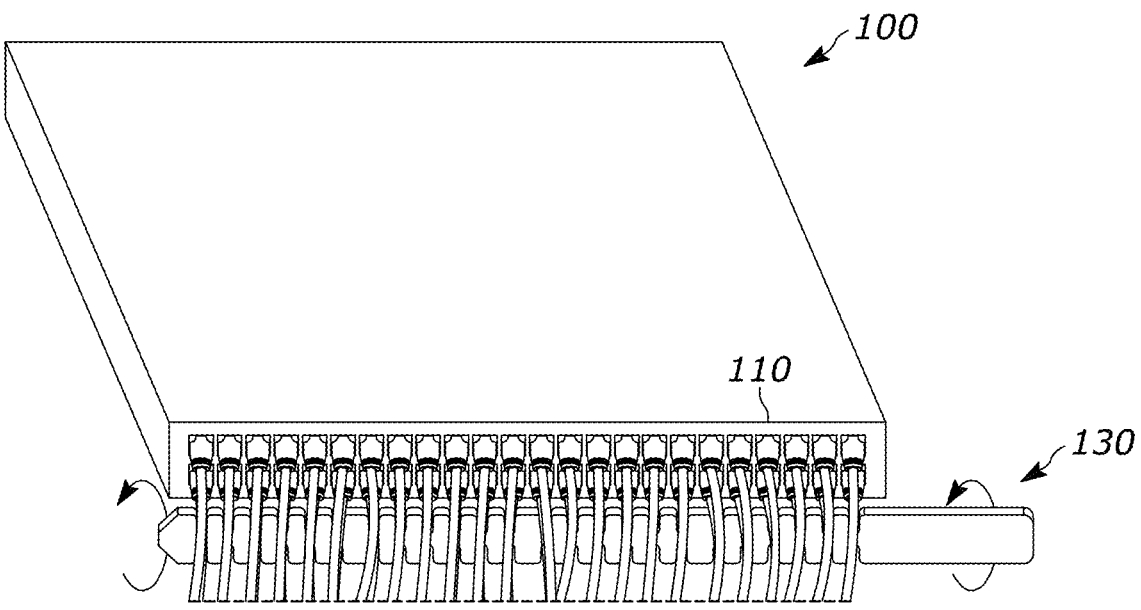
FIG. 4B illustrates a next step in the process for disconnecting cables from the multiport network device using the cable holding tool.

FIG. 4B illustrates a next step that involves rotating the cable holding tool 130 approximately 90 degrees (e.g., to within ±10%) so that the major surfaces of the cable holding tool are approximately parallel (e.g., to within ±10%) to the faceplate 110 of the multiport network device 100 and inserting the cables 120 into the notches 140 that align with the corresponding cables while the cables are still connected to the multiport network device. In an example, the cables are inserted by a person pushing each individual cable into a corresponding notch of the cable holding tool. In an example, the cables can be inserted into the corresponding notches in a stepwise process, e.g., one cable at a time. In an example, the cables on the bottom row are inserted into the corresponding notches before the cable holding tool is rotated a full 90 degrees, and then the top row of cables is inserted into the corresponding notches as the cable holding tool is rotated up towards the faceplate. In another example, the cables on the top row are inserted into the corresponding notches before the cable holding tool is rotated a full 90 degrees, and then the bottom row of cables is inserted into the corresponding notches as the cable holding tool is rotated down towards the faceplate. In another example, the cables are inserted into the corresponding notches from left to right or from right to left. There may be other ways in which all of the cables are inserted into the corresponding notches of the cable holding tool. In an example, the cables are inserted into the notches while the cables are still connected to the multiport network device so that the position of the cables relative to each other and relative to the multiport network device does not change. In another example, the cables are removed from the connectors one at a time and inserted into corresponding notches of the cable handling tool.

Figure 4C:
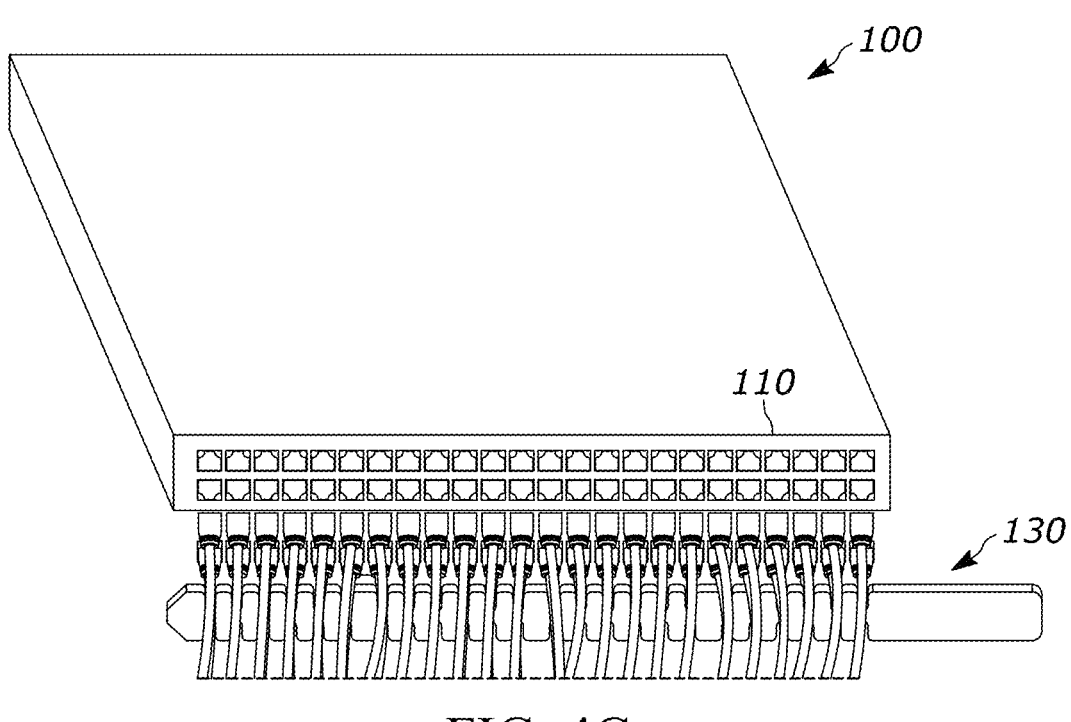
FIG. 4C illustrates a next step in the process for disconnecting cables from the multiport network device using the cable holding tool.

Once all the cables 120 are inserted into the corresponding notches 140 of the cable handling tool 130, the cables are disconnected from the multiport network device 100. FIG. 4C illustrates a next step that involves disconnecting the cables while the major surfaces of the cable holding tool are approximately parallel (e.g., to within ±10%) to the faceplate 110 of the multiport network device. Because the cables are all inserted into the notches of the cable holding tool, the positions of the cables is maintained even though the cables are being disconnected from the multiport network device. In another example in which the cables are disconnected from the multiport network device and inserted into the cable holding tool one at a time, all of the cables will be disconnected upon disconnecting the last cable.

Figure 4D:
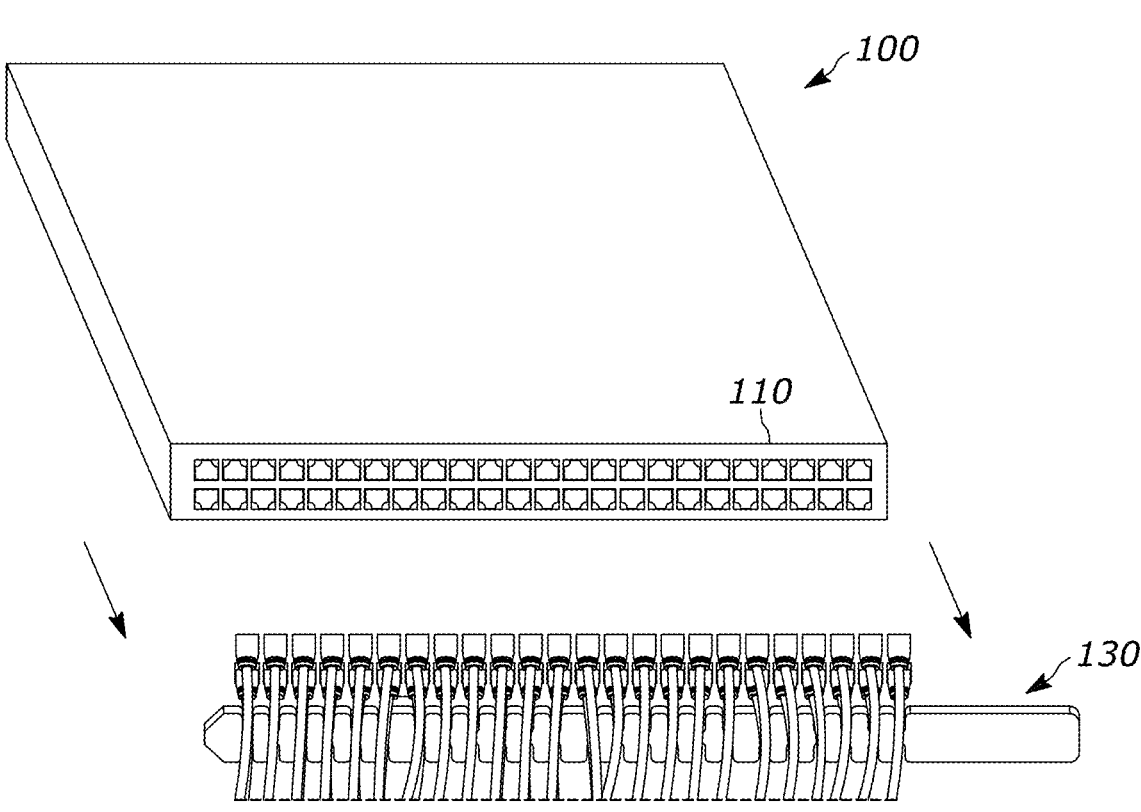
FIG. 4D illustrates a next step in the process for disconnecting cables from the multiport network device using the cable holding tool.

After all of the cables 120 are disconnected from the multiport network device 100, the cable holding tool 130 and the held cables can be moved away from the multiport network device, e.g., moved away from the faceplate 110 of the multiport network device. FIG. 4D illustrates the cable holding tool and the held cables being moved away from the multiport network device. Once the cable holding tool and the held cables are moved away from the multiport network device, the multiport network device can be removed from its position (e.g., removed from a rack) and replaced with another multiport network device, for example, a multiport network device that has the same arrangement of ports.

Although one example of a process for using the cable holding tool while disconnecting cables from a multiport network device is described, variations of the process are possible.

Figure 5A:
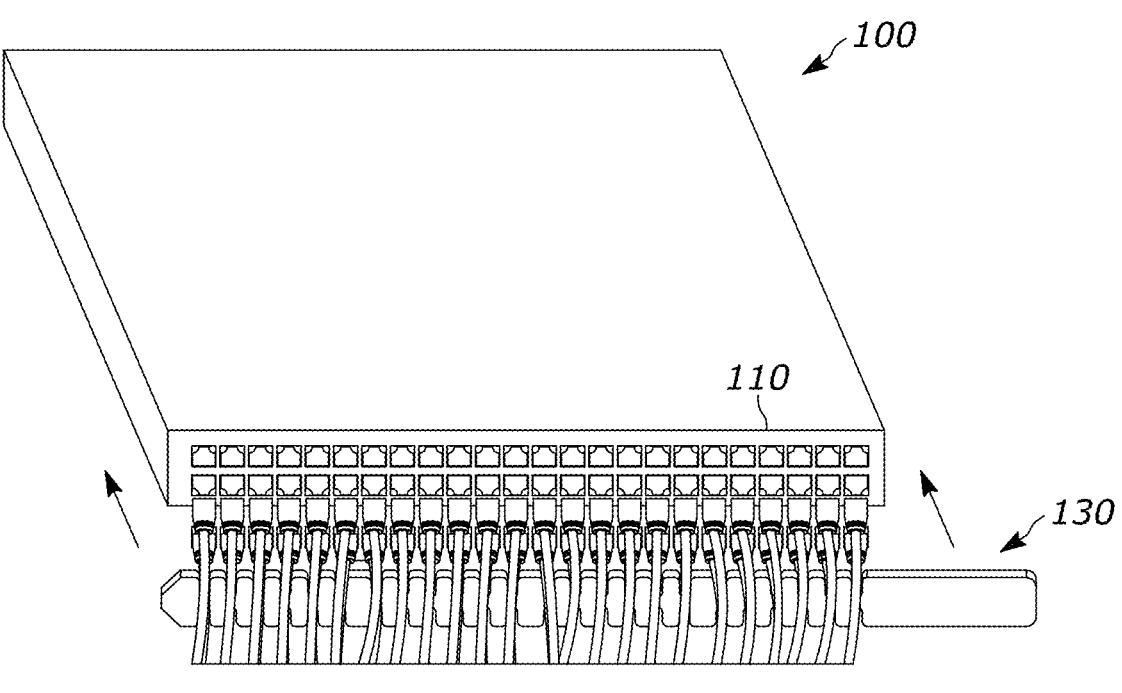
FIG. 5A illustrates a step in a process for connecting cables to a multiport network device using a cable holding tool.

When the cables 120 that are held in the cable holding tool 130 are to be connected to a multiport network device 100, the cable holding tool and the held cables are brought into close proximity to a multiport network device. FIG. 5A illustrates the cable holding tool and the held cables being brought into close proximity to the multiport network device. For example, the cable holding tool and held cables are moved close enough to the ports 102 of the multiport network device that the male port connectors of the cables can be inserted into the female port connectors of the multiport network device.

Figure 5B:
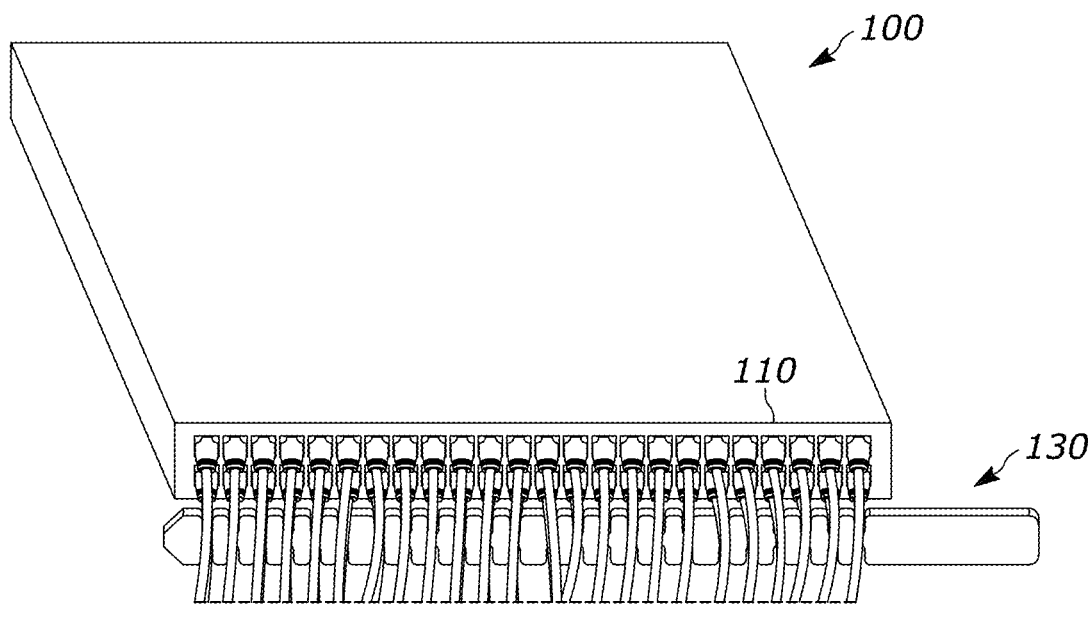
FIG. 5B illustrates a next step in the process for connecting cables to the multiport network device using the cable holding tool.

In a next step of the cable connection process, the cables 120 are connected to the corresponding ports 102 of the multiport network device 100. In particular, the cables are connected to ports at corresponding positions as dictated by the configuration of the cable holding tool 130. FIG. 5B illustrates all 48 of the cables being connected to corresponding ports of the multiport network device while the cables are still held by the cable holding tool. In an example, the cables are connected to the multiport network device by a person pushing a male connector into the corresponding female connector of the corresponding port on the multiport network device. In an example, the cables are connected one by one while the cables are held in the cable holding tool and while the cable holding tool is approximately parallel to faceplate of multiport network device. For example, the cables may be connected to the multiport network device one row at a time (e.g., 24 on the top row, then 24 on the bottom row), or the cables may be connected to the multiport network device from left to right one column at a time (e.g., both top and bottom cables at column 1 to column 24).

Once all of the cables are connected to the corresponding ports of the multiport network device, the cables can be removed from the notches of the cable holding tool and the cable holding tool can be removed. In another example, the cables can be removed from the cable holding tool and connected to the multiport network device one at a time.

Figure 5C:
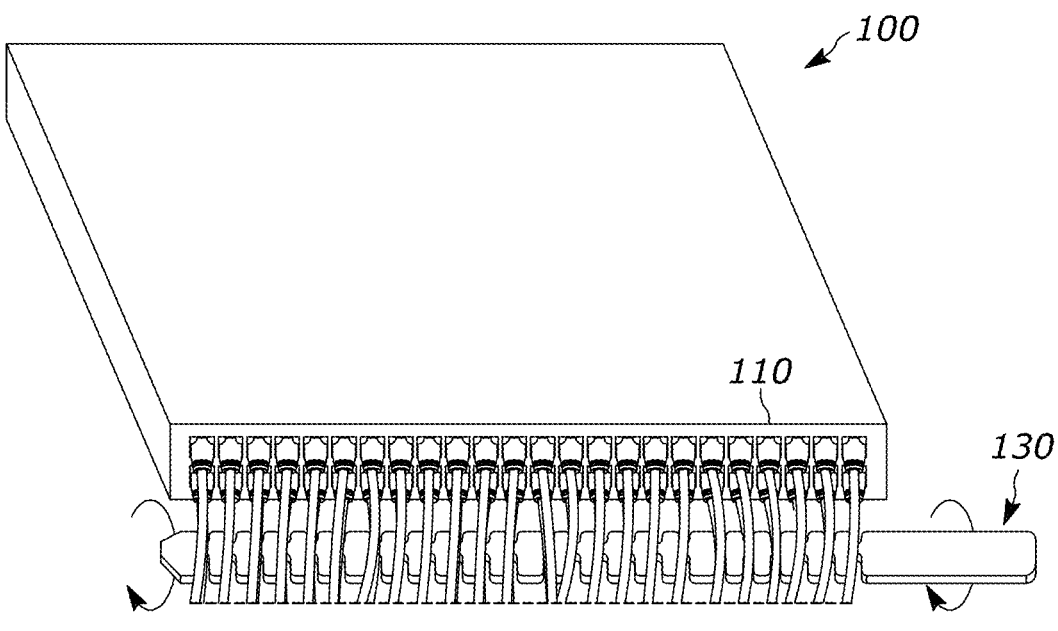
FIG. 5C illustrates a next step in the process for connecting cables to the multiport network device using the cable holding tool.

In an example, the cables 120 are removed from the bottom row of notches 140 and then from the top row of notches. As the cables on the bottom row are removed from the corresponding notches, the cable holding tool 130 is rotated from a parallel position to more of a perpendicular position relative to the faceplate 110 of the multiport network device 100. Next the cables are removed from the top row of notches and the cable holding tool is rotated into a position in which the first and second major surfaces of the cable holding tool are approximately perpendicular (e.g., to within ±10%) to the faceplate of the multiport network device and located between the two rows of cables. FIG. 5C illustrates the position of the cable holding tool relative to the multiport network device and to the cables after all of the cables have been removed from the notches of the cable holding tool.

Although an example of an order of connecting the cables 120 to the multiport network device 100 and removing the cables from the cable holding tool 130 is described, variations from the example are possible. For example, the removal process may be done in stepwise process and may involve removing all of the cables from the bottom row of notches 140, then rotating the cable holding tool "down" and removing the cables from the top row of notches. Or, the removal process may involve removing all of the cables from the top row of notches, then rotating the cable holding tool "down" and removing the cables from the bottom row of notches. Alternatively, the connection/removal could be implemented from the left to right or from right to left. The connection/removal process may involve varying degrees of rotation of the tool as the connection/removal operations are being performed.

Figure 5D:
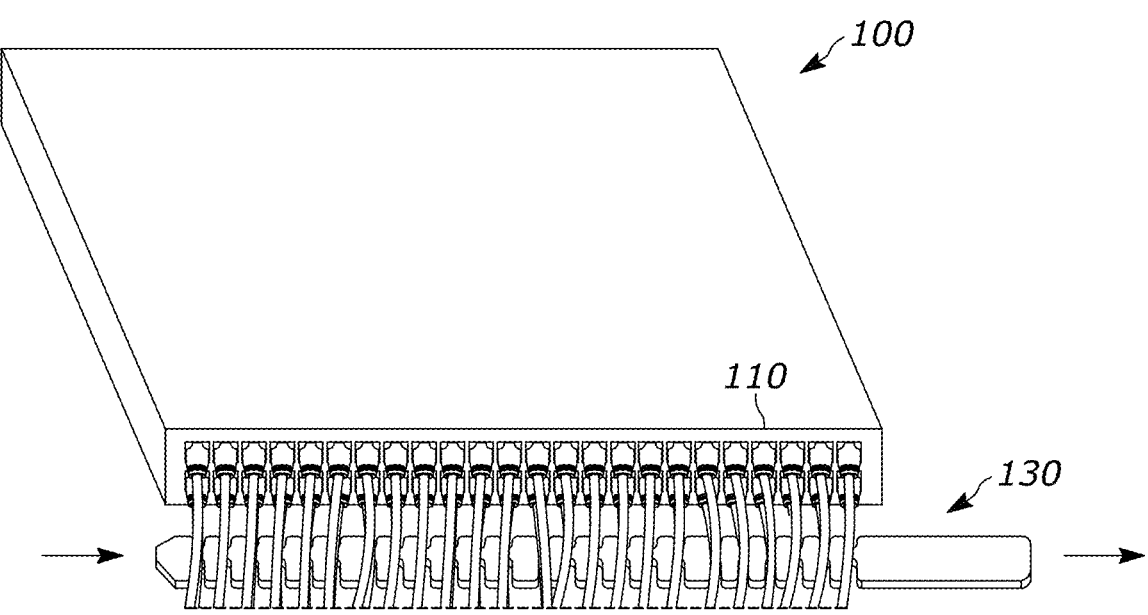
FIG. 5D illustrates a next step in the process for connecting cables to the multiport network device using the cable holding tool.

Once all of the cables 120 have been removed from the cable holding tool 130 and the first and second major surfaces of the cable holding tool are approximately perpendicular (e.g., to within ±10%) to the faceplate 110 of the multiport network device 100, the cable holding tool can be moved away from the multiport network device. In an example, the cable holding device is moved away from the multiport network device by sliding the cable holding tool between the two rows of cables and across the faceplate of the multiport network device until the cable holding tool is completely away from the multiport network device and from the cables. FIG. 5D illustrates the cable holding tool being slide out from between the two rows to cables that are connected to the multiport network device. As illustrated in FIG. 5D, the cable holding tool is approximately perpendicular (e.g., to within ±10%) to the faceplate of the multiport network device as the cable holding tool is moved. The cable holding tool could be slide from left to right or from right to left relative to the faceplate of the multiport network device. In an example, the cable holding tool is slid out from between the rows of cables by pulling from the handle end of the cable holding device.

Figure 6:
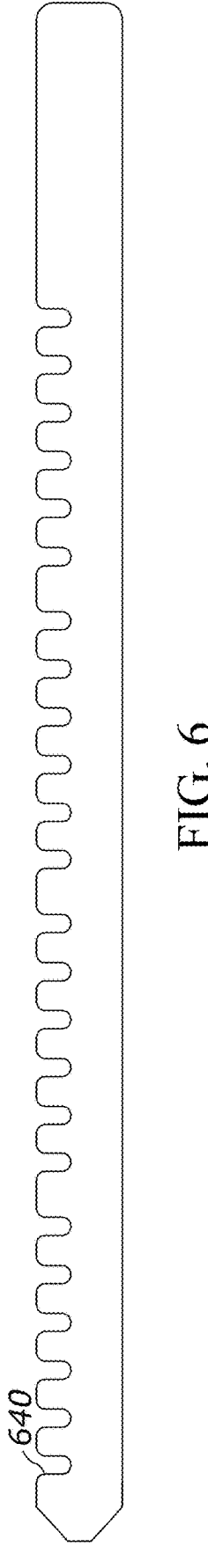
FIG. 6 is an example of a cable holding tool that a single row of notches formed on one long edge of an elongated body.

Although in the examples described herein, the cable holding tool has two rows of notches, in other examples, the cable holding tool may have a single row of notches. FIG. 6 is an example of a cable holding tool 630 that has a single row of notches 640 formed on one long edge of an elongated body. Such a configuration may be useful for multiport network devices that have only one row of ports. However, a cable holding tool with two rows of notches as described above may also be used with a multiport network device that has only one row of ports.

Figures 7A, 7B:
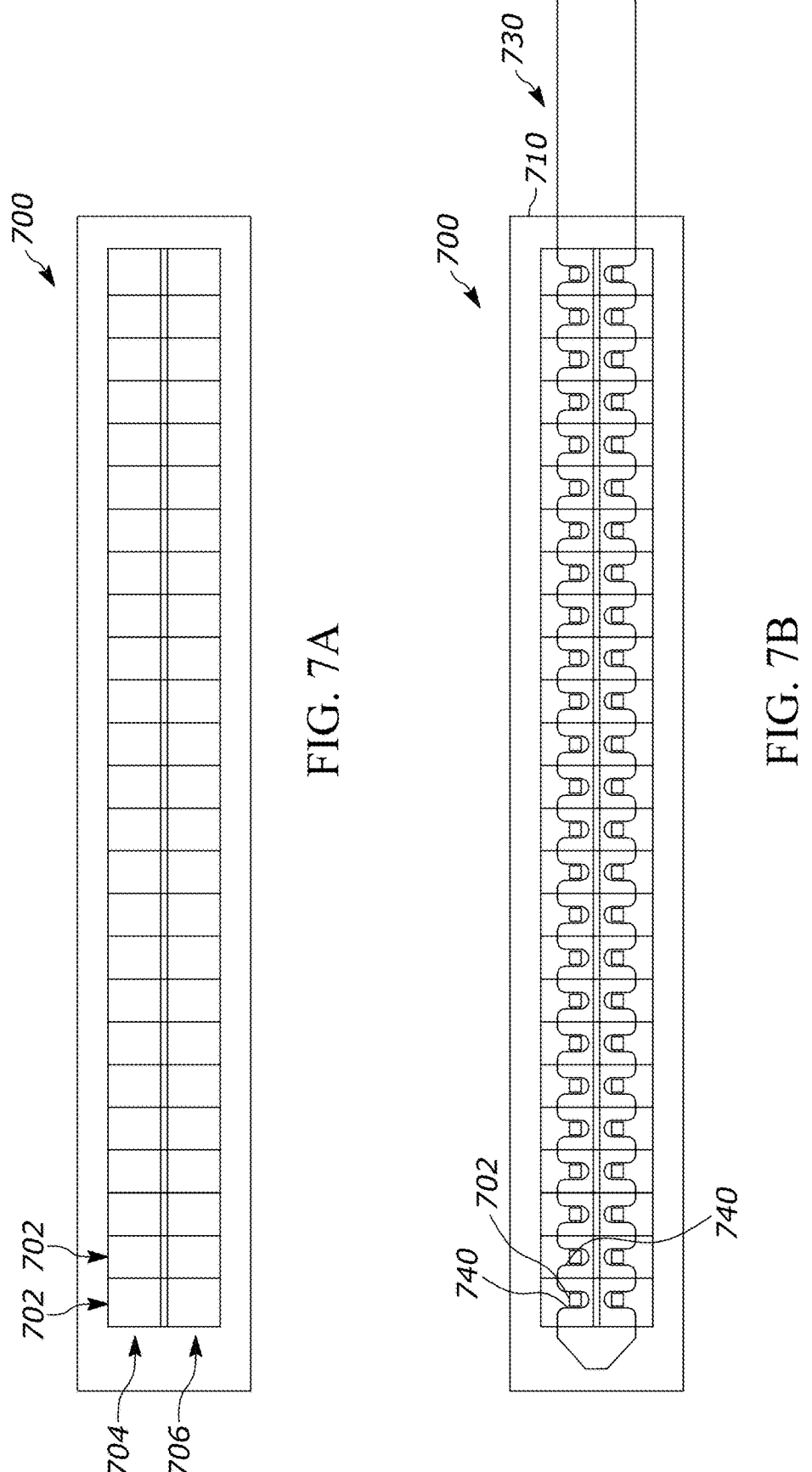
FIG. 7A is a front view of a multiport network device that has a different spacing of ports.
FIG. 7B is a front view of the multiport network device from FIG. 7A with a cable holding tool laid over the face of the multiport network device.

In the example described above, the multiport network device has a particular spacing of ports. It should be noted that multiport network devices may have different spacings of ports. FIG. 7A is a front view of a multiport network device 700 that has a different spacing of ports 702. In the example of FIG. 7A, the multiport network device has two rows 704 and 706 of 12 ports with the ports in a row having the same separation distance from an adjacent port in the same row. Also, in the example of FIG. 7A, the vertical separation distance of the rows of ports is different from the example described with reference to FIG. 3A. In particular, the vertical separation distance of the rows of ports in the example of FIG. 7A is greater than in the example of FIG. 3A. As described above, the spacing of the notches in the cable holding tool should match the spacing of ports of a targeted multiport network device. FIG. 7B is a front view of the multiport network device from FIG. 7A with a cable holding tool 730 laid over the faceplate 710 of the multiport network device. As illustrated in FIG. 7B, the positions of the notches 740 of the cable holding tool match the positions of the ports of the multiport network device. As is described herein, the cable holding tool enables a set of cables to be disconnected and then reconnected (e.g., to a new multiport network device swapped into the same rack) in an efficient way that maintains the order of the cables.

The notches are configured to securely hold the cables once the cables are inserted into the notches. For example, once inserted into a notch, a cable should not come out of the notch without some externally applied force. Additionally, the notches are configured to enable a person to manually insert a cable into a notch and manually remove a cable from a notch with ease. For example, the notches should be configured such that a person can insert a cable into a notch and remove a cable from a notch with an amount of force that can be applied by fingers of a typical adult.

Figures 8A, 8B:
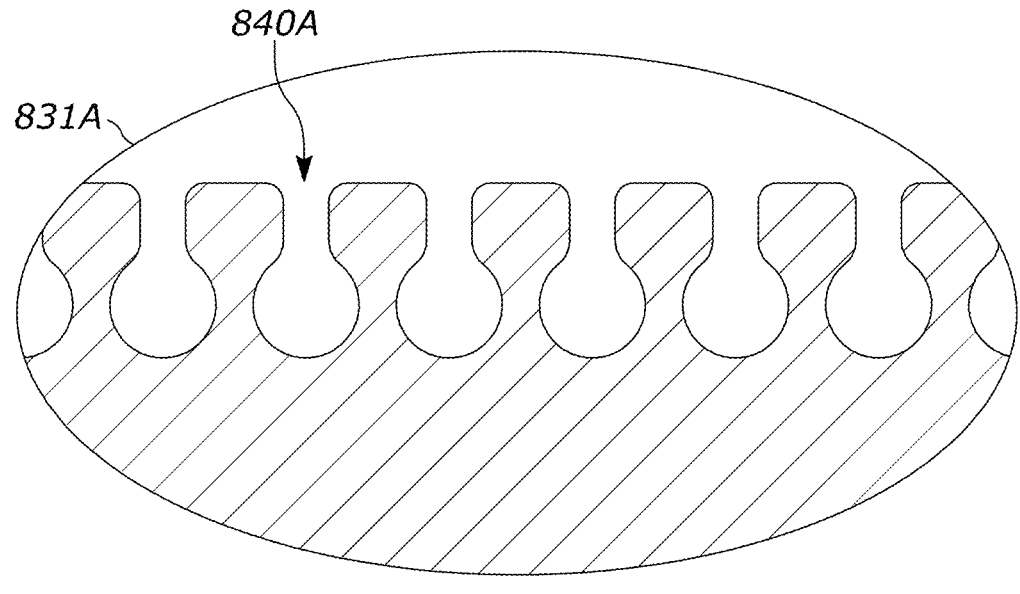
FIG. 8A is an expanded view of some notches of a cable holding tool.
FIG. 8B is an expanded view of some notches of a cable holding tool that have a rectangular shape.

FIG. 8A is an expanded view of some notches 840A of a portion 831A of a cable holding tool. In the example of FIG. 8A, the notches have a "bulbous" shape. Example dimensions of the cable holding tool are shown in FIG. 8A in millimeters. It should be noted that these dimensions are for example purposes and may vary depending on the dimensions and layout of the multiport network device and/or the type of communications media. In the example of FIG. 8A, the notches form a 4.5 mm wide opening and a 6 mm wide holding area. In an example, the notches form an approximately 4.5 mm wide opening (e.g., ±10%, or ±5%) and an approximately 6 mm wide holding area (e.g., ±10%, or ±5%).

FIG. 8B is an expanded view of some notches 840B of a portion 831B of a cable holding tool that have a rectangular shape. For example, the narrow opening of the notches may have rectangular walls and the portion of the notches where the cables are held may have a rectangular shape. In some examples, the communication media may be rectangular and the rectangular shape may enable the cable to be rotated so that a narrow dimension of the cable is slide into the notch and then rotated so that a wider dimension of the cable is wider than the opening.

Figure 8C:
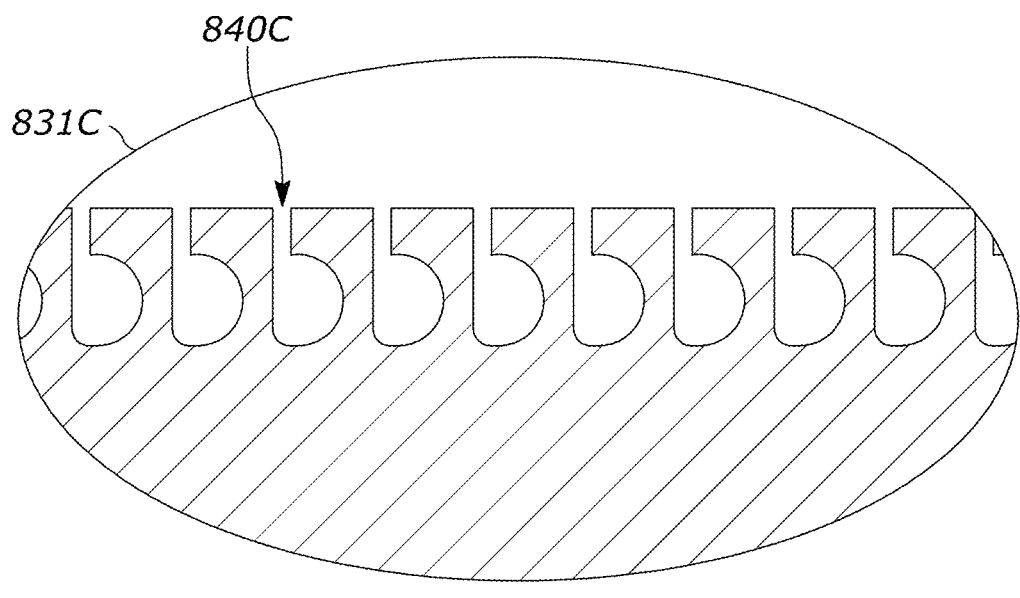
FIG. 8C is an expanded view of some notches of a cable holding tool that have a semicircular shape.

FIG. 8C is an expanded view of some notches 840C of a portion 831C of a cable holding tool that have a semicircular shape. For example, the narrow opening of the notches may have a linear portion that extends to a semicircular portion, which is the portion in which the cable is held. In the example, the narrow opening is wide enough to allow a cable to be inserted into the semicircular area with force applied from fingers.

Figure 9:
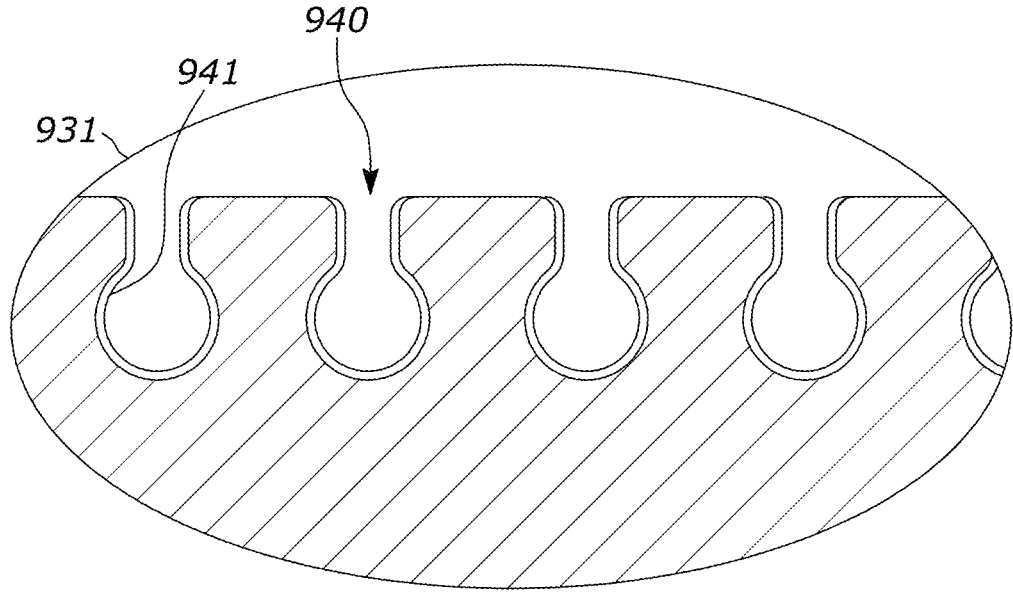
FIG. 9 is an expanded view of some notches of a cable holding tool that have a portion of the notches covered with a coating material.

In an example, the notches of a cable holding tool may have a coating of material over the material of the elongated body. FIG. 9 is an expanded view of some notches 940 of a portion 931 of a cable holding tool that have a portion of the notches covered with a coating 941. For example, a portion of the notches may be covered with a coating that provides some utility, such as gripping the cable and/or protecting the cable from damage. In an example, the elongated body of the cable holding tool may be made of a hard plastic and the coating may be a softer material (e.g., a softer plastic) that provides some tackiness that can hold the cable in place and/or some softness that can protect the cable from damage. In an example, the cable holding tool may be made of acrylic, polycarbonate, acetal, thermoplastic polymers (e.g., acrylonitrile Butadiene Styrene (ABS)), a graphite compound, or aluminum, e.g., with a plastic coating.

FIG. 10 is a process flow diagram of a method for disconnecting cables from a multiport network device using a cable holding tool. At block 1002, a cable holding tool is inserted between two rows of computer network cables that are connected to a multiport network device, the cable holding tool having two rows of notches on opposite long edges of the cable holding tool. At block 1004, after the cable holding tool is inserted between the two rows of computer network cables, the computer network cables are inserted into the notches of the two rows of notches. At block 1006, after the computer network cables are inserted into the notches of the two rows of notches, the computer network cables are disconnected from the multiport network device. At block 1008, after the computer network cables are disconnected from the multiport network device, the cable holding tool, which has the computer network cables inserted into the notches of the two rows of notches, is moved away from the multiport network device.

FIG. 11 is a process flow diagram of a method for connecting cables to a multiport network device using a cable holding tool. At block 1102, the cable holding tool, which has the computer network cables inserted into notches of two rows of notches of the cable holding tool, is moved into close proximity to a faceplate of a second multiport network device. At block 1104, after the cable holding tool is moved into close proximity to the faceplate of the second multiport network device, the computer network cables are connected to the second multiport network device. At block 1106, after the computer network cables are connected to the second multiport network device, the computer network cables are removed from the notches of the two rows of notches. At block 1108, after the computer network cables are removed from the notches of the two rows of notches, the cable holding tool is moved away from the second multiport network device.

The term "cable" may refer to a communications media that supports the communication of digital data via electromagnetic signals. The cable may, for example, be a twisted pair wire cable or an optical cable, both of which are well known in the field.

In an example, approximately perpendicular is perpendicular to within ±10 degrees of perpendicular, or to within ±5 degrees of perpendicular. In an example, approximately parallel is parallel to within ±10 degrees of parallel, or to within ±5 degrees of parallel.

Although the cable holding device is described as having notches, the cable holding device may include some other type of cable holding mechanism. For example, the elongated body of the cable holding device may be equipped with hooks, clamps, or some other type of cable holding mechanism.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for managing computer network cables, the method comprising:
    inserting a cable holding tool between two rows of computer network cables that are connected to a multiport network device, the cable holding tool having two rows of notches on opposite long edges of the cable holding tool;
    after the cable holding tool is inserted between the two rows of computer network cables, inserting the computer network cables into the notches of the two rows of notches;
    after the computer network cables are inserted into the notches of the two rows of notches, disconnecting the computer network cables from the multiport network device; and
    after the computer network cables are disconnected from the multiport network device, moving the cable holding tool, which has the computer network cables inserted into the notches of the two rows of notches, away from the multiport network device.

2. The method of claim 1, wherein inserting the cable holding tool between the two rows of computer network cables involves sliding the cable holding tool across a faceplate of the multiport network device.

3. The method of claim 1, wherein inserting the cable holding tool between the two rows of computer network cables involves sliding the cable holding tool across a faceplate of the multiport network device while first and second major surfaces of the cable holding tool are approximately perpendicular to the faceplate of the multiport network device.

4. The method of claim 1, wherein inserting the computer network cables into the notches of the two rows of notches includes rotating the cable holding tool so that a major surface of the cable holding tool is approximately parallel to a faceplate of the multiport network device.

5. The method of claim 4, wherein rotating the cable holding tool involves rotating the cable holding tool from a position in which first and second major surfaces of the cable holding tool are approximately perpendicular to the faceplate of the multiport network device to a position in which the first and second major surfaces of the cable holding tool are approximately parallel to the faceplate of the multiport network device.

6. The method of claim 1, further comprising:

moving the cable holding tool, which has the computer network cables inserted into notches of two rows of notches of the cable holding tool, into close proximity to a faceplate of a second multiport network device;

after the cable holding tool is moved into close proximity to the faceplate of the second multiport network device, connecting the computer network cables to the second multiport network device;

after the computer network cables are connected to the second multiport network device, removing the computer network cables from the notches of the two rows of notches; and after the computer network cables are removed from the notches of the two rows of notches, moving the cable holding tool away from the second multiport network device.

7. The method of claim 6, wherein removing the computer network cables from the notches of the two rows of notches includes rotating the cable holding tool.

8. The method of claim 6, wherein removing the computer network cables from the notches of the two rows of notches includes rotating the cable holding tool to be approximately perpendicular to the faceplate of the multiport network device.

9. The method of claim 6, wherein removing the computer network cables from the notches of the two rows of notches includes rotating the cable holding tool approximately 90 degrees.

10. A method for managing computer network cables, the method comprising:

moving a cable holding tool, which has computer network cables inserted into notches of two rows of notches of the cable holding tool, into close proximity to a faceplate of a multiport network device;

after the cable holding tool is moved into close proximity to the faceplate of the multiport network device, connecting the computer network cables to the multiport network device;

after the computer network cables are connected to the multiport network device, removing the computer network cables from the notches of the two rows of notches; and after the computer network cables are removed from the notches of the two rows of notches, moving the cable holding tool away from the multiport network device.

11. The method of claim 10, wherein removing the computer network cables from the notches of the two rows of notches includes rotating the cable holding tool.

12. The method of claim 10, wherein removing the computer network cables from the notches of the two rows of notches includes rotating the cable holding tool to be approximately perpendicular to the faceplate of the multiport network device.

13. The method of claim 10, wherein removing the computer network cables from the notches of the two rows of notches includes rotating the cable holding tool approximately 90 degrees.

14. The method of claim 10, moving the cable holding tool away from the multiport network device involves sliding the cable holding tool across the faceplate of the multiport network device.

15. The method of claim 10, moving the cable holding tool away from the multiport network device involves sliding the cable holding tool across the faceplate of the multiport network device while the cable holding tool is approximately perpendicular to the faceplate of the multiport network device.

* * * * *